US009804592B2

(12) United States Patent
Fukao

(10) Patent No.: US 9,804,592 B2
(45) Date of Patent: Oct. 31, 2017

(54) OPTIMIZATION PROGRAM AND SUBSTRATE PROCESS SYSTEM

(75) Inventor: Kazuya Fukao, Toyota (JP)

(73) Assignee: FUJI MACHINE MFG. CO., LTD., Chiryu (JP)

(*) Notice: Subject to any disclaimer, the term of this patent is extended or adjusted under 35 U.S.C. 154(b) by 344 days.

(21) Appl. No.: 14/423,499

(22) PCT Filed: Aug. 24, 2012

(86) PCT No.: PCT/JP2012/071465
§ 371 (c)(1),
(2), (4) Date: Feb. 24, 2015

(87) PCT Pub. No.: WO2014/030255
PCT Pub. Date: Feb. 27, 2014

(65) Prior Publication Data
US 2015/0301523 A1    Oct. 22, 2015

(51) Int. Cl.
*G05B 19/418* (2006.01)
*H05K 13/08* (2006.01)

(52) U.S. Cl.
CPC ......... *G05B 19/4189* (2013.01); *H05K 13/08* (2013.01); *G05B 2219/45031* (2013.01)

(58) Field of Classification Search
CPC ...... G05B 19/4189; G05B 2219/45031; H05K 13/08
See application file for complete search history.

(56) References Cited

U.S. PATENT DOCUMENTS

| 8,447,566 B2* | 5/2013 | Maenishi | H05K 13/08 29/830 |
| 2010/0249971 A1* | 9/2010 | Maenishi | G05B 19/41865 700/102 |
| 2010/0325860 A1 | 12/2010 | Maenishi | |

FOREIGN PATENT DOCUMENTS

| JP | 2011-134919 | | 7/2011 |
| JP | 2012-099654 | | 5/2012 |
| JP | KR 20120047751 A | * | 5/2012 |
| JP | 2012-114467 A | | 6/2012 |
| KR | 10-2012-0047751 A | | 5/2012 |

OTHER PUBLICATIONS

Extended European Search Report dated Sep. 23, 2016 in Patent Application No. 12883369.6.
(Continued)

*Primary Examiner* — Ryan Jarrett
(74) *Attorney, Agent, or Firm* — Oblon, McClelland, Maier & Neustadt, L.L.P.

(57) ABSTRACT

An optimization device, that optimizes a process procedure for each of a plurality of process machines in a substrate process system in which circuit substrates can be transported on two paths, including a first process for setting a process procedure for each of the process machines so as to optimize a total process time that is the sum of a process time for each of the plurality of process machines for a circuit substrate being transported on one of the two paths, and a process time for each of the plurality of process machines for a circuit substrate being transported on the other of the two paths; and a second process for setting a process procedure for each of the process machines so as to optimize the process times.

18 Claims, 5 Drawing Sheets

(56) References Cited

OTHER PUBLICATIONS

International Search Report dated Sep. 18, 2012 in PCT/JP12/071465 filed Aug. 24, 2012.
Office Action dated Jul. 19, 2016 in Japanese Patent Application No. 2014-531469.

* cited by examiner

OPTIMIZATION PROGRAM AND SUBSTRATE PROCESS SYSTEM

TECHNICAL FIELD

The present application relates to a substrate process system in which a circuit substrate being transported is sequentially processed, and an optimization program or device that optimizes the process procedure of a process machine in the system.

BACKGROUND ART

Typically, a substrate process system includes a plurality of arranged process machines. Circuit substrates are transported from an upstream process machine to a downstream process machine among the plurality of process machines. There is a substrate process system in which each process machine includes a pair of transportation devices, and circuit substrates are transported by the pair of transportation devices so as to improve productivity. That is, in this system, the circuit substrates are transported on two paths. A substrate process system disclosed in PTL 1 is an example of a system in which circuit substrates are transported on two paths.

PTL 1: JP-A-2011-134919

SUMMARY

Technical Problem

In the system in which the circuit substrates are transported on two paths, the circuit substrates being transported may be processed on one path of the two paths, or the circuit substrates being transported may be processed on the two paths. That is, the circuit substrates may be processed in a single lane or in dual lanes. When the circuit substrates are processed in a single lane, it is possible to reduce a process time by optimizing a process time for apiece of circuit substrate for each of the process machines, more specifically, by optimizing a process time for each of the process machines for a piece of circuit substrate being transported in the single lane.

In contrast, when the circuit substrates are processed in dual lanes, it is possible to reduce a process time by optimizing a process time for two pieces of the circuit substrates for each of the process machines, more specifically, by optimizing a total time that is the sum of a process time for each of the process machines for one of the circuit substrates being transported on one path, and a process time for each of the process machines for the other of the circuit substrates being transported on the other path. As such, a single-lane process and a dual-lane process are different in a method of optimizing a process time. The present disclosure is made taking into consideration this point, and an object of the present disclosure is to provide an optimization program or device by which it is possible to reduce a process time by optimizing a process time for each of the process machines and a substrate process system in which it is possible to process circuit substrates in a single lane and dual lanes.

Solution to Problem

According to claim 1 of the present disclosure, to achieve the object, there is provided an optimization program or device that optimizes a process procedure for each of a plurality of process machines in a substrate process system which includes the plurality of process machines, each of which has a pair of substrate transportation devices for transporting circuit substrates on two paths and are arranged in a row, and in which the circuit substrates are transported on the two paths from an upstream process machine to a downstream process machine among the plurality of process machines, the program or device including: first process setting means for setting a process procedure for each of the plurality of process machines so as to optimize a total process time that is the sum of a process time for each of the plurality of process machines for a circuit substrate being transported on one of the two paths, and a process time for each of the plurality of process machines for a circuit substrate being transported on the other of the two paths; second process setting means for setting a process procedure for each of the plurality of process machines so as to optimize the process time for each of the plurality of process machines for a circuit substrate being transported on one of the two paths, and to optimize the process time for each of the plurality of process machines for a circuit substrate being transported on the other of the two paths; and procedure selecting means for selecting any one of a first process procedure and a second process procedure based on the number of circuit substrates planned for production in the substrate process system, the first process procedure being a process procedure that is set for each of the plurality of process machines by the first process setting means, and the second process procedure being a process procedure that is set for each of the plurality of process machines by the second process setting means.

According to another aspect of the present disclosure, a process performed on one of the two paths indicates a process that is performed on one of opposite surfaces of a circuit substrate, and a process performed on the other of the two paths indicates a process that is performed on the other of the opposite surfaces of a circuit substrate.

According to another aspect of the present disclosure, the procedure selecting means selects any one of the first process procedure and the second process procedure, based on the number of circuit substrates that are processed on only one of the two paths among the circuit substrates planned for production, and the number of circuit substrates that are processed on both of the two paths among the circuit substrates planned for production.

According to another aspect of the present disclosure, the procedure selecting means computes a total time required to perform the first process procedures by the entirety of the plurality of process machines, and a total time required to perform the second process procedures by the entirety of the plurality of process machines, using the number of circuit substrates processed on one of the two paths, and the number of circuit substrates processed on both of the two paths, and selects the first process procedure when the total time required to perform the first process procedures is shorter than the total time required to perform the second process procedures, and selects the second process procedure when the total time required to perform the second process procedures is shorter than the total time required to perform the first process procedures.

A substrate process system according to another aspect of the present disclosure includes: a plurality of process machines, each of which has a pair of substrate transportation devices for transporting circuit substrates on two paths and which are arranged in a row; and a control device that controls the operation of each of the plurality of process machines. The circuit substrates are transported on the two paths from an upstream process machine to a downstream process machine among the plurality of process machines. The control device includes a first process procedure-based control unit that controls the operation of each of the plurality of process machines according to a process procedure which is set for each of the plurality of process machines so as to optimize a total process time that is the sum of a process time for each of the plurality of process machines for a circuit substrate being transported on one of the two paths, and a process time for each of the plurality of process machines for a circuit substrate being transported on the other of the two paths; and a second process procedure-based control unit that controls the operation of each of the plurality of process machines according to a process procedure which is set for each of the plurality of process machines so as to optimize a process time for each of the plurality of process machines for a circuit substrate being transported on one of the two paths, and to optimize a process time for each of the plurality of process machines for a circuit substrate being transported on the other of the two paths.

According to another aspect of the present disclosure, the control device has a control selection unit that selects any one of the first process procedure-based control unit and the second process procedure-based control unit, which controls the operation of each of the plurality of process machines.

According to another aspect of the present disclosure, the control selection unit selects any one of the first process procedure-based control unit and the second process procedure-based control unit, which controls the operation of each of the plurality of process machines, based on the number of circuit substrates planned for production in the substrate process system.

According to another aspect of the present disclosure, the control selection unit selects any one of the first process procedure-based control unit and the second process procedure-based control unit, which controls the operation of each of the plurality of process machines, based on the number of circuit substrates that are processed on only one of the two paths among the circuit substrates planned for production, and the number of circuit substrates that are processed on both of the two paths among the circuit substrates planned for production.

Advantageous Effects

According to an aspect of the present disclosure, the first process setting means sets the first process procedure in such a manner that the process time in a dual-lane process is optimized, and the second process setting means sets the second process procedure in such a manner that the process time in a single-lane process is optimized. The procedure selecting means selects one of the first process procedure and the second process procedure based on the number of circuit substrates planned for production. Specifically, for example, when the number of circuit substrates planned for production is S, and the number of single lane processed circuit substrates is A, the number of dual lane processed circuit substrates is (S−A). At this time, the number (A pieces) of single lane processed circuit substrates compared to the number (S pieces) of circuit substrates planned for production further increases to the extent that the number (S pieces) of circuit substrates planned for production decreases, and the second process procedure is preferably selected. In contrast, the number ((S−A) pieces) of dual lane processed circuit substrates compared to the number (S pieces) of circuit substrates planned for production further increases to the extent that the number (S pieces) of circuit substrates planned for production increases, and the first process procedure is preferably selected. For this reason, for example, when the number (S pieces) of circuit substrates planned for production is small, the second process procedure is selected. In contrast, when the number (S pieces) of circuit substrates planned for production is large, the first process procedure is selected, and thereby it is possible to optimize a process time for each of the process machines, and to reduce the process time.

According to another aspect of the present disclosure, electronic components are mounted on opposite surfaces of a circuit substrate. Typically, when producing circuit substrates, on the opposite surfaces of which electronic components are mounted, at an initial stage of the production, a single-lane process is performed, and after the processing of A pieces of the circuit substrates in a single lane is completed, a dual-lane process is performed. According to another aspect of the present disclosure, it is possible to obtain the sufficient effects of selecting one of the first process procedure and the second process procedure based on the number of circuit substrates planned for production.

According to another aspect of the present disclosure, one of the first process procedure and the second process procedure is selected based on the number (A pieces) of single lane processed circuit substrates, and the number ((S−A) pieces) of dual lane processed circuit substrates. Accordingly, it is possible to more effectively optimize a process time.

According to another aspect of the present disclosure, the optimization program or device computes the total time required to perform the first process procedures and the total time required to perform the second process procedures, based on the number (A pieces) of single lane processed circuit substrates, and the number ((S−A) pieces) of dual lane processed circuit substrates. When the total time required to perform the first process procedures is shorter than the total time required to perform the second process procedures, the first process procedure is selected, and when the total time required to perform the second process procedures is shorter than the total time required to perform the first process procedures, the second process procedure is selected. Accordingly, it is possible to reliably reduce a process time.

According to another aspect of the present disclosure, the substrate process system selectively executes the control of the process machine according to the first process procedure and the control of the process machine according to the second process procedure. Accordingly, it is possible to select an optimum process procedure depending on the type of a process, and it is possible to reduce a process time.

According to another aspect of the present disclosure, the substrate process system is provided with the control selection unit for selecting any one of the control of the process machine according to the first process procedure and the control of the process machine according to the second process procedure. Accordingly, it is possible to select an optimum control.

According to another aspect of the present disclosure, the substrate process system selects one of the first process procedure and the second process procedure, based on the number of circuit substrates planned for production.

According to another aspect of the present disclosure, the substrate process system computes the total time required to perform the first process procedures and the total time required to perform the second process procedures, based on the number (A pieces) of single lane processed circuit substrates, and the number ((S−A) pieces) of dual lane processed circuit substrates. When the total time required to perform the first process procedures is shorter than the total time required to perform the second process procedures, the first process procedure is selected, and when the total time required to perform the second process procedures is shorter than the total time required to perform the first process procedures, the second process procedure is selected.

DESCRIPTION OF EMBODIMENTS

Figure 1:
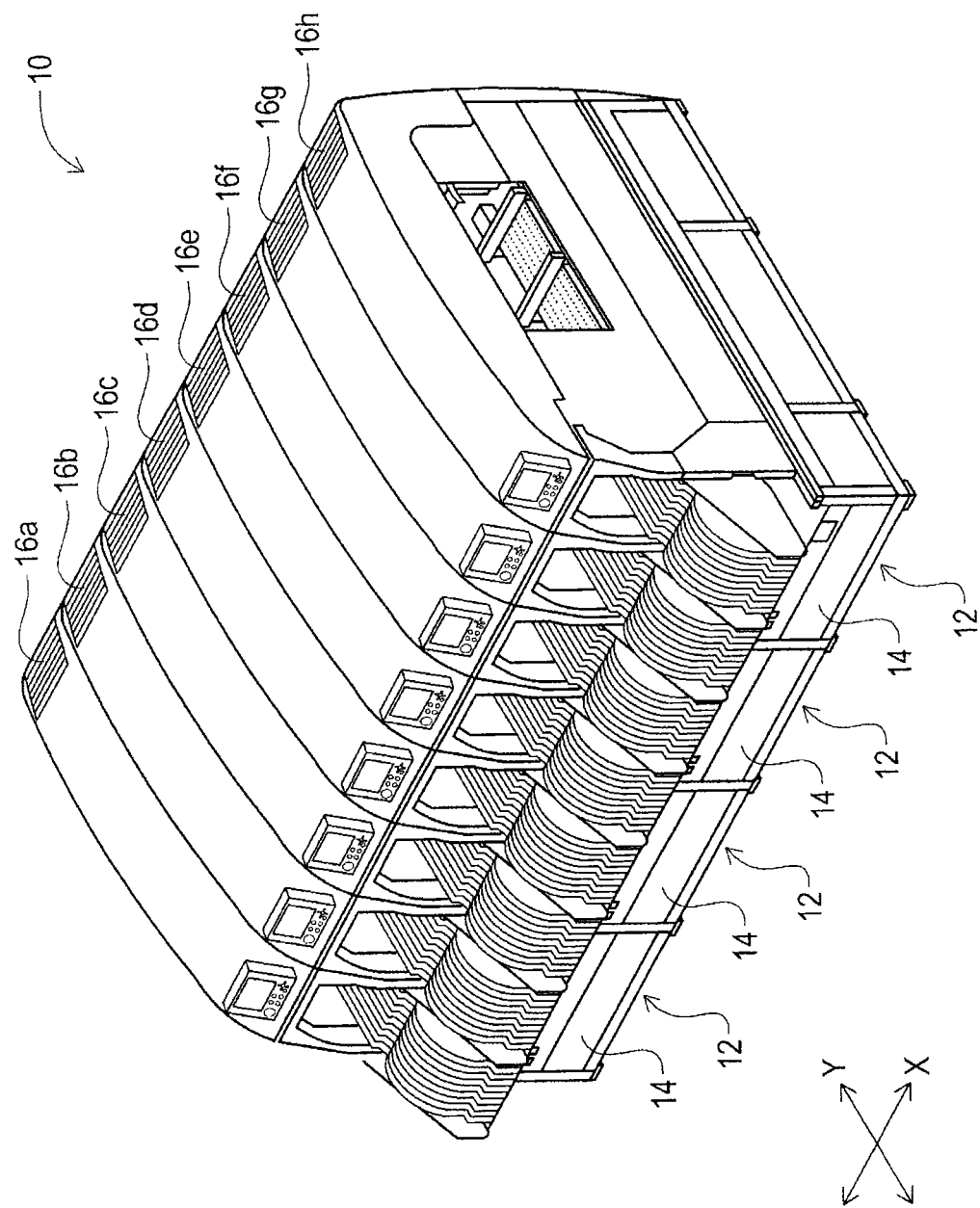
FIG. 1 is a perspective view illustrating a substrate process system that is an exemplary embodiment of the present disclosure.

Hereinafter, an exemplary embodiment of the present disclosure will be described in detail with reference to the accompanying drawings.
<Configuration of Substrate Process System> FIG. 1 Illustrates a substrate process system 10. The system 10 illustrated in FIG. 1 is a system for mounting electronic components on a circuit substrate. The substrate process system 10 includes four electronic component mounting apparatuses (hereinafter, may be simply referred to as a "mounting apparatus") 12. The four mounting apparatuses 12 are provided in a row while being disposed adjacent to each other. In the following description, an X-axis direction refers to the line-up direction of the mounting apparatuses 12, and a Y-axis direction refers to a horizontal direction orthogonal to the line-up direction.

Figure 2:
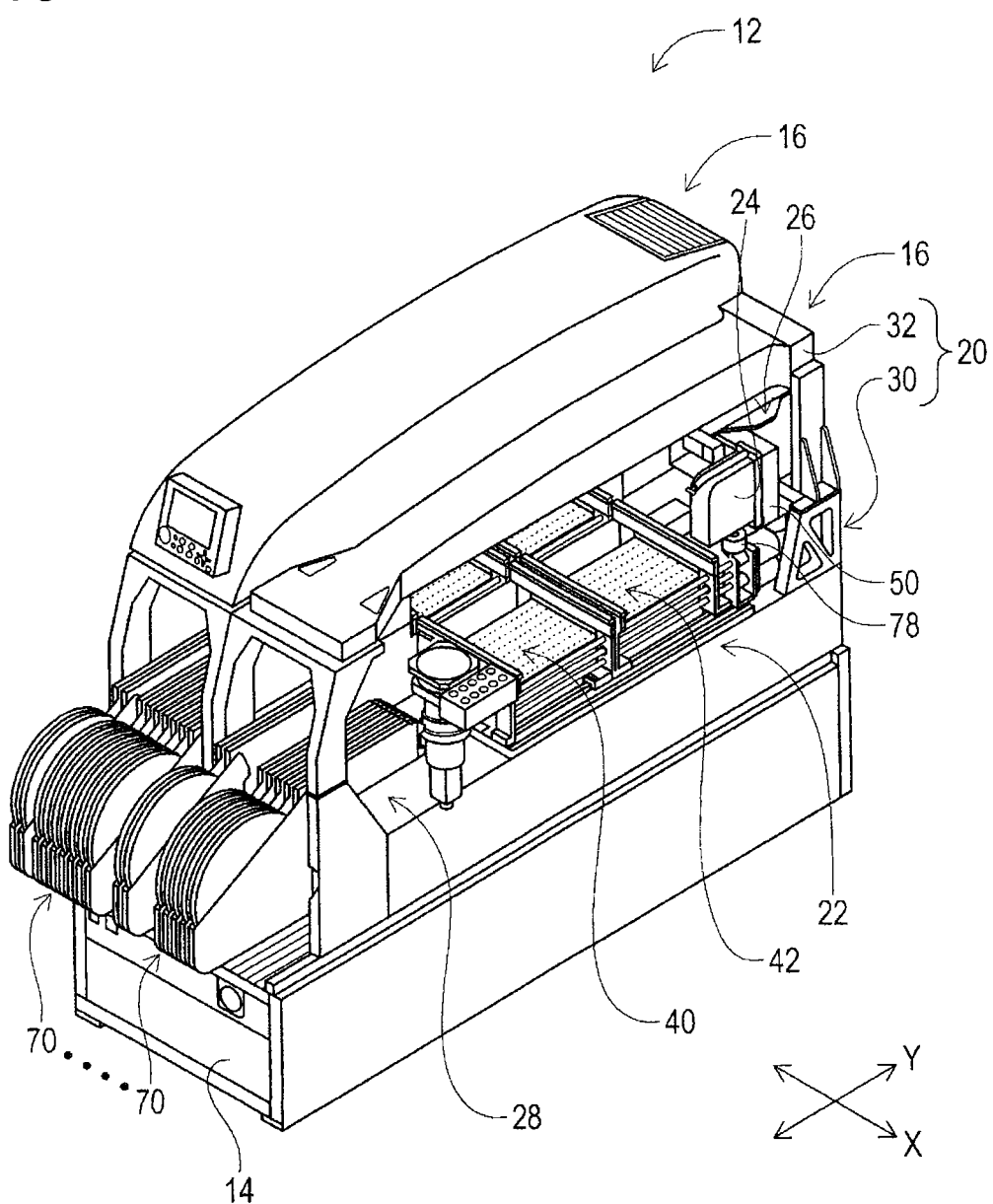
FIG. 2 is a perspective view illustrating a mounting device of the substrate process system.

The four mounting apparatuses 12 have substantially the same configuration. For this reason, one of the four mounting apparatuses 12 will be representatively described. As illustrated in FIG. 2, the mounting apparatus 12 has one system base 14, and two adjacent mounting machines 16 on the system base 14. Basically, the mounting machine 16 includes a mounting machine main body 20; a transportation device 22; a mounting head 24; a mounting head moving device (hereinafter, may be simply referred to as a "moving device") 26; and a supply device 28. The mounting machine main body 20 includes a frame portion 30, and a beam portion 32 suspended above the frame portion 30.

The transportation device 22 includes two conveyor devices 40 and 42. The two conveyor devices 40 and 42 are provided on the frame portion 30 so as to be parallel with each other and to extend in the X-axis direction. The two conveyor devices 40 and 42 transport circuit substrates (supported by the conveyor devices 40 and 42) in the X-axis direction, respectively, using an electromagnetic motor 46 (refer to FIG. 3). A circuit substrate is fixedly held at a predetermined position by a substrate holding device 48 (refer to FIG. 3). In order to differentiate between the conveyor device 40 and the conveyor device 42, one of the two conveyor devices 40 and 42 may be referred to as a first conveyor device 40, and the other may be referred to as a second conveyor device 42.

The moving device 26 is an X-Y robot type of moving device. The moving device 26 includes an electromagnetic motor 52 (refer to FIG. 3) that slides a slider 50 in the X-axis direction and an electromagnetic motor 54 (refer to FIG. 3) that slides the slider 50 in the Y-axis direction. The mounting head 24 is attached to the slider 50, and the mounting head 24 moves to an arbitrary position on the frame portion 30 due to the operation of the two electromagnetic motors 52 and 54.

The supply device 28 is a feeder type of supply device, and is provided in a front end portion of the frame portion 30. The supply device 28 has a tape feeder 70. The tape feeder 70 accommodates taped components in a rolled state. The taped components are electronic components which are taped. The tape feeder 70 feeds the taped components using a feeding device 76 (refer to FIG. 3). Accordingly, a feeder type of the supply device 28 supplies an electronic component to a supply position through the feeding of the taped components.

The mounting head 24 mounts electronic components on a circuit substrate. The mounting head 24 has a suction nozzle 78 provided on a lower end surface of the mounting head 24. The suction nozzle 78 is communicated with a positive and negative air supply device 80 (refer to FIG. 3) via a negative-pressure air passage and a positive-pressure air passage. The suction nozzle 78 suctions and holds an electronic component using a negative pressure, and releases a held electronic component using a positive pressure. The mounting head 24 has a nozzle lifting device 82 (refer to FIG. 3) that lifts the suction nozzle 78 up and down. The mounting head 24 changes the vertical position of a held electronic component using the nozzle lifting device 82.

Figure 3:
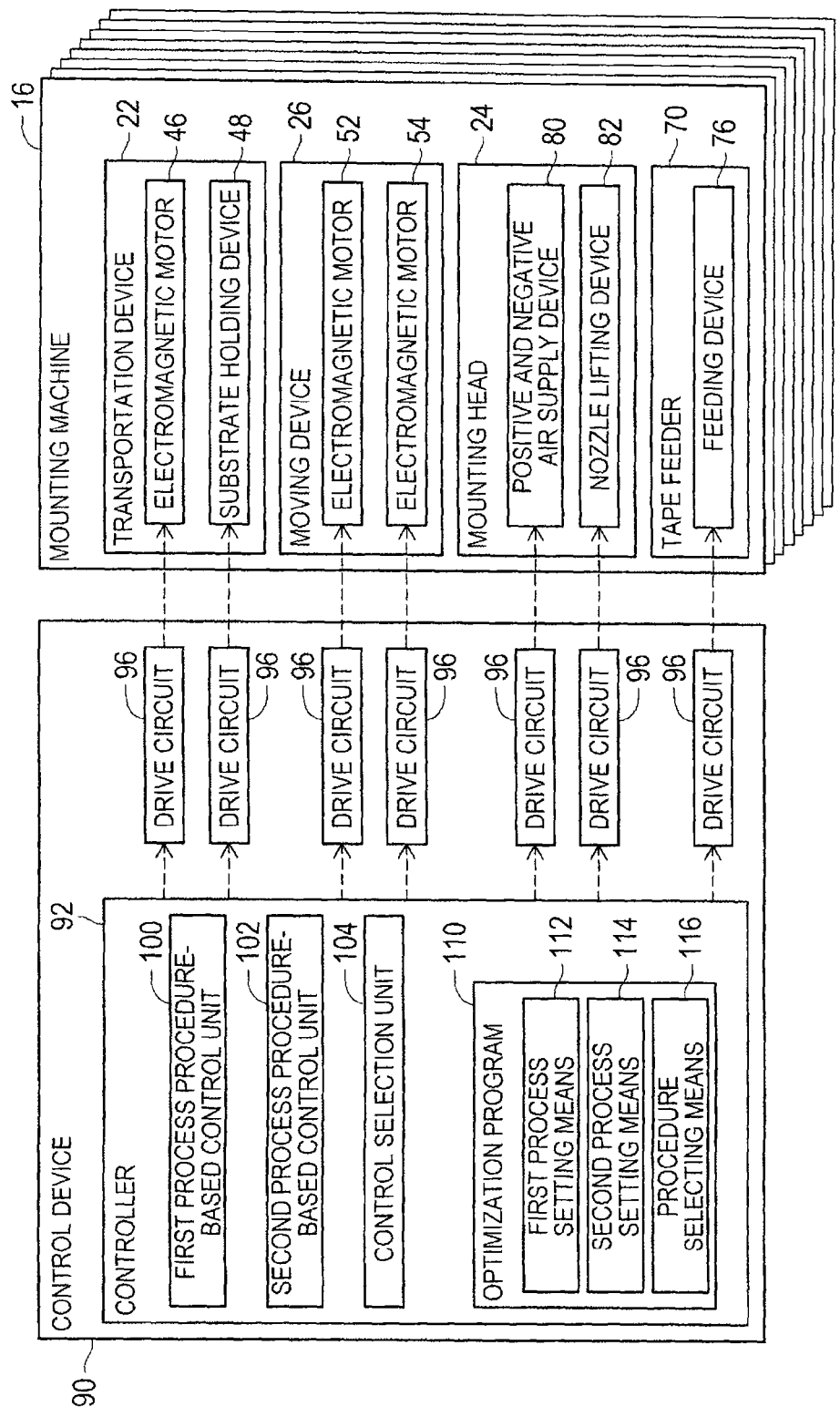
FIG. 3 is a block diagram illustrating a control device of the substrate process system.

As illustrated in FIG. 3, the substrate process system 10 includes a control device 90. The control device 90 includes a controller 92 and a plurality of drive circuits 96. The plurality of drive circuits 96 are connected to the electromagnetic motors 46, 52, and 54, the substrate holding device 48, the feeding device 76, the positive and negative air supply device 80, and the nozzle lifting device 82. The controller 92 includes a CPU, a ROM, and a RAM, has a computer as a main body, and is connected to the plurality of drive circuits 96. Accordingly, the operation of the transportation device 22, the moving device 26, and the like is controlled by the controller 92.

<Processing of Opposite Surfaces of Circuit Substrate Using Substrate Process System>

In the substrate process system 10 having the above-mentioned configuration, the first conveyor device 40 transports circuit substrates in the eight mounting machines 16, and each of the mounting machines 16 mounts electronic components on one surface of each circuit substrate. Then, the second conveyor device 42 transports inverted circuit substrates in the eight mounting machines 16, and each of the mounting machines 16 mounts electronic components on the other surface of each circuit substrate. Accordingly, in the substrate process system 10, it is possible to produce the circuit substrates, on the opposite surfaces of each of which the electronic components are mounted.

Specifically, first, in a process of mounting electronic components on one surface of each circuit substrate, circuit substrates are sequentially transported into the first conveyor device 40 of the mounting machine 16 that is disposed on the most upstream side among the eight mounting machines 16. In the following description, the eight mounting machines 16 are respectively referred to as a first mounting machine 16a, a second mounting machine 16b, a third mounting machine 16c, a fourth mounting machine 16d, a fifth mounting machine 16e, a sixth mounting machine 16f, a seventh mounting machine 16g, and an eighth mounting machine 16h which are sequentially disposed from the most upstream side to the most downstream side.

A plurality of circuit substrates are sequentially transported from the first mounting machine 16a to the eighth mounting machine 16h, and each of the mounting machines 16 mounts electronic components on one surface of each of the circuit substrates. Then, the circuit substrates are transported out from the eighth mounting machine 16h. The circuit substrates (which are transported out) are inverted and transported into the second conveyor device 42 of the first mounting machine 16a. For this reason, the mounting machines 16 mount electronic components on one surface of each of the circuit substrates until the circuit substrates are transported out from the first conveyor device 40 of the eighth mounting machine 16h after being transported into the first conveyor device 40 of the first mounting machine 16a. In contrast, when the inverted circuit substrates are transported into the second conveyor device 42 of the first mounting machine 16a, the mounting machines 16 mount electronic components on one surface and the other surface of each of the circuit substrates. That is, at an initial stage of the production, a mounting process for predetermined A pieces of the circuit substrates among S pieces of the circuit substrates planned for production is performed on one path, in other words, in a single lane. Then, when the mounting process for the predetermined A pieces of the circuit substrates is completed, a mounting process is performed on two paths, in other words, in dual lanes. That is, the mounting processes for (S−A) pieces of the circuit substrates are performed in dual lanes.

When an S-th circuit substrate (S indicates the number of circuit substrates planned for production) is transported into the first conveyor device 40 of the first mounting machine 16a, the transportation of circuit substrates into the first conveyor device 40 is stopped. Then, when the S-th circuit substrate (S indicates the number of circuit substrates planned for production) is transported out from the first conveyor device 40 of the eighth mounting machine 16h, the mounting processes in the dual lanes end, and a mounting process is performed only in the second conveyor device 42. That is, a single-lane mounting process for the predetermined pieces (A pieces) of the circuit substrates is performed in the second conveyor devices 42.

As described above, each of the mounting machines 16 is provided with the two conveyor devices 40 and 42, and can perform a dual-lane mounting process. However, since each of the mounting machines 16 is provided with only the one mounting head 24, during a dual-lane mounting process, it is necessary to mount electronic components on two pieces of the circuit substrates using the one mounting head 24. For this reason, when the number of (S−A) pieces of the circuit substrates being processed in dual lanes (hereinafter, may be referred to as "the number of dual lane processed circuit substrates")) is large, a process time for each of the mounting machines 16 is preferably optimized. That is, total times for each mounting machines 16 are preferably equalized. Here, the total times are the sum of a total time for each of the mounting machines 16, and in each of the mounting machines 16, the total time is the sum of a process time (hereinafter, may be referred to as a "first process time") for a circuit substrate transported to the first conveyor device 40, and a process time (hereinafter, may be referred to as a "second process time") for a circuit substrate transported to the second conveyor device 42.

Figure 4A:
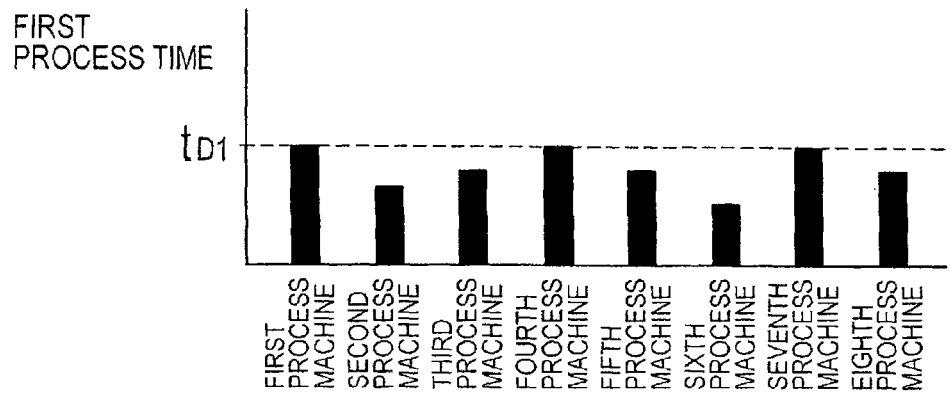
FIG. 4A is a graph illustrating a first process time for each mounting machine which is set according to a first process procedure.
Figure 4B:
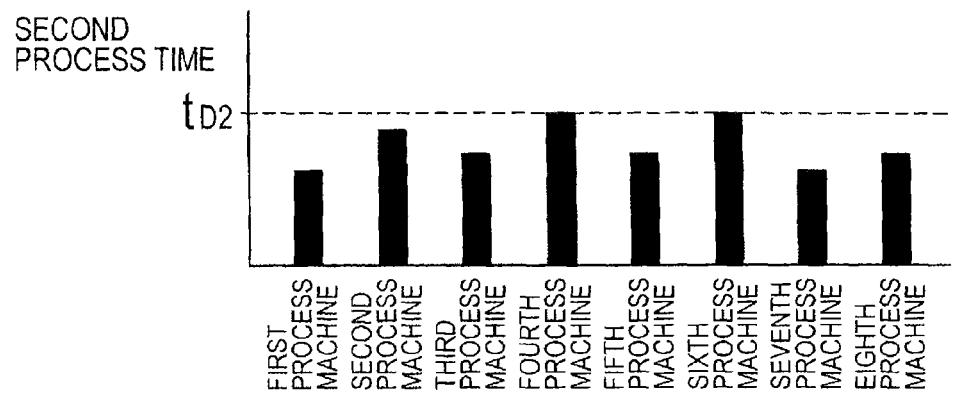
FIG. 4B is a graph illustrating a second process time for each mounting machine which is set according to the first process procedure.
Figure 4C:
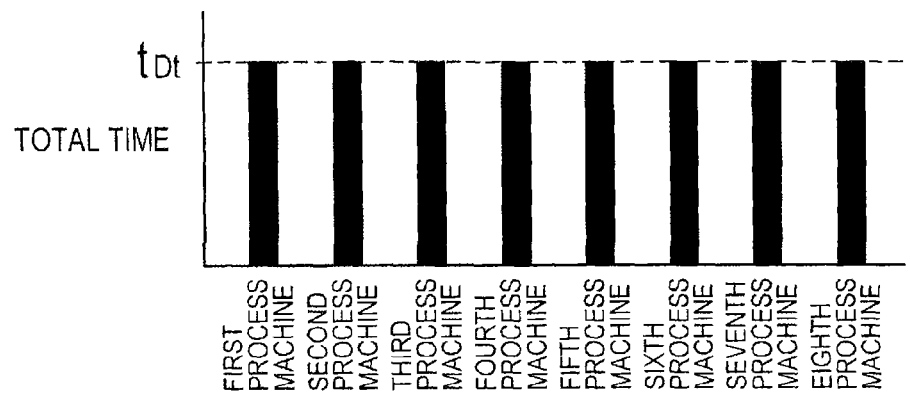
FIG. 4C is a graph illustrating a total time for each mounting machine which is set according to the first process procedure.

Here, FIG. 4 illustrates a relationship between the first process time, the second process time, and the total time when the total times are equalized. FIG. 4A is a graph illustrating the first process time for each of the mounting machines 16. FIG. 4B is a graph illustrating the second process time for each of the mounting machines 16. FIG. 4C is a graph illustrating the total time for each of the mounting machines 16. As understood from the graphs, the first process time and the second process time for each of the mounting machines 16 are different; however, the total times for the mounting machines 16 are equalized. Accordingly, it is possible to reduce a time required to perform mounting processes in dual lanes.

In contrast, during a single-lane mounting process, electronic components are mounted on one piece of circuit substrate using one mounting head 24. For this reason, when the number (A pieces) of circuit substrates being processed in a single lane (hereinafter, may be referred to as "the number of single lane processed circuit substrates")) is large, a process time for each of the mounting machines 16 in each lane is preferably optimized. That is, preferably, the first process times for the mounting machines 16 are equalized and the second process times for the mounting machines 16 are equalized.

Figure 5A:
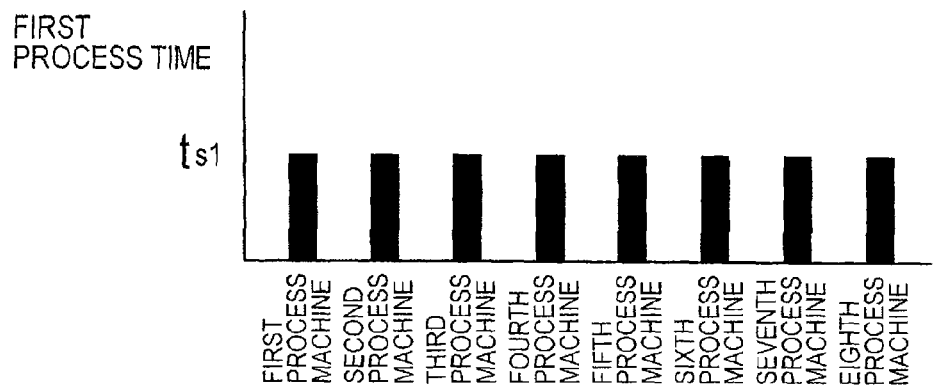
FIG. 5A is a graph illustrating the first process time for each mounting machine which is set according to a second process procedure.
Figure 5B:
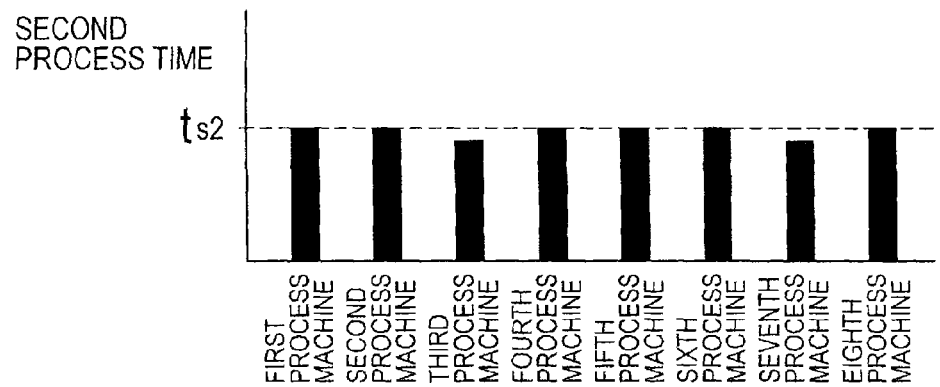
FIG. 5B is a graph illustrating the second process time for each mounting machine which is set according to the second process procedure.
Figure 5C:
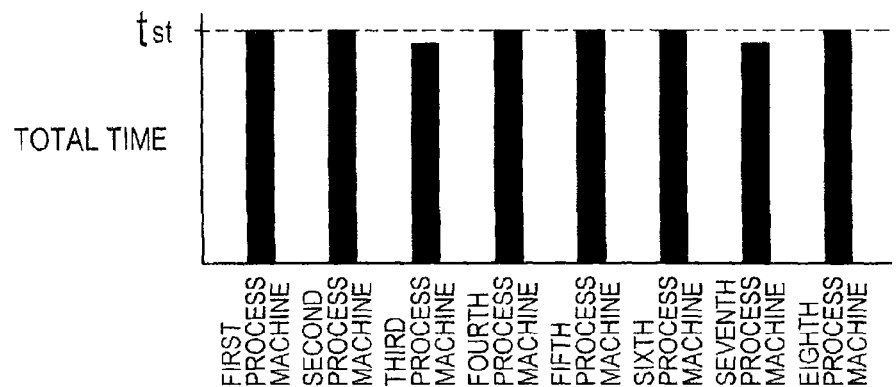
FIG. 5C is a graph illustrating the total time for each mounting machine which is set according to the second process procedure.

Here, FIG. 5 illustrates a relationship between the first process time, the second process time, and the total time when the first process times are equalized and the second process time are equalized. FIG. 5A is a graph illustrating the first process time for each of the mounting machines 16. FIG. 5B is a graph illustrating the second process time for each of the mounting machines 16. FIG. 5C is a graph illustrating the total time for each of the mounting machines 16. As understood from the graphs, the first process times are normalized to $t_{S1}$, and the second process times are normalized to $t_{S2}$. The normalized first process time $t_{S1}$ is less than a maximum value $t_{D1}$ (refer to FIG. 4A) of the first process time when the total times are equalized. The normalized second process time $t_{S2}$ is less than a maximum value $t_{D2}$ (refer to FIG. 4B) of the second process time when the total times are equalized. That is, when the first process times are equalized and the second process times are equalized, it is possible to reduce a time required to perform a mounting process in a single lane.

The total time when the first process times are equalized and the second process times are equalized becomes $t_{St}$. In contrast, as illustrated in FIG. 4C, the total time when the total times are equalized becomes $t_{Dt}$, and is less than $t_{St}$. In light of these facts, it can be understood that it is possible to reduce a time required to perform a mounting process in dual lanes through the equalization of the total times.

As described above, when the number ((S−A) pieces) of dual lane processed circuit substrates is large, the operation of each of the mounting machines 16 is preferably controlled in order for the total times to be equalized. In contrast, when the number (A pieces) of single lane processed circuit substrates is large, the operation of each of the mounting machines 16 is preferably controlled in such a manner that the first process times are equalized, and the second process times are equalized. In light of these facts, in the substrate process system 10, a process procedure (hereinafter, may be referred to as a "first process procedure") of the mounting machine 16 is set in order for the total times to be equalized, and a process procedure (hereinafter, may be referred to as a "second process procedure") of the mounting machine 16 is set in such a manner that the first process times are equalized, and the second process times are equalized. Then, any one of these process procedures is selected based on the number ((S−A) pieces) of dual lane processed circuit substrates, and the number (A pieces) of single lane processed circuit substrates. The following variables for mounting the electronic components by each of the mounting machines 16 are set in the process procedure of the mounting machine 16: the types of the electronic component, the number of electronic components, the mounting locations of the electronic components and the like, and each of the mounting machines 16 is operated according to the process procedure.

Specifically, first, when each of the mounting machines 16 is operated according to the first process procedure, a grand total of the process times $T_1$ of the entirety of the mounting machines 16 is computed according to the following expression.

$$T_1 = t_{D1} \times A + t_{Dr} \times (S-A) + t_{D2} \times A$$

Here, $[t_{D1} \times A]$ is a total process time of the first conveyor devices 40 in operation in a single lane. $[t_{Dr} \times (S-A)]$ is a total process time for an operation in dual lanes. $[t_{D2} \times A]$ is a total process time of the second conveyor devices 42 in operation in a single lane.

In addition, when each of the mounting machines 16 is operated according to the second process procedure, a grand total of the process times $T_2$ of the entirety of the mounting machines 16 is computed according to the following expression.

$$T_2 = t_{S1} \times A + t_{Sr} \times (S-A) + t_{S2} \times A$$

Here, $[t_{S1} \times A]$ is a total process time of the first conveyor devices 40 in operation in a single lane. $[t_{Sr} \times (S-A)]$ is a total process time for an operation in dual lanes. $[t_{S2} \times A]$ is a total process time of the second conveyor devices 42 in operation in a single lane.

Subsequently, the grand total of the process times $T_1$ and the grand total of the process times $T_2$ are compared to each other. Then, when the grand total of the process times $T_1$ is shorter than the grand total of the process times $T_2$, the operation of the mounting machine 16 is controlled according to the first process procedure. In contrast, when the grand total of the process times $T_2$ is shorter than the grand total of the process times $T_1$, the operation of the mounting machine 16 is controlled according to the second process procedure. Accordingly, it is possible to control the operation of the mounting machine 16 according to a process procedure corresponding to the number ((S−A) pieces) of dual lane processed circuit substrates and the number (A pieces) of single lane processed circuit substrates, and thereby it is possible to reduce a process time.

As illustrated in FIG. 3, the controller 92 of the control device 90 has a first process procedure-based control unit 100; a second process procedure-based control unit 102; and a control selection unit 104. The first process procedure-based control unit 100 is a functional unit that controls the operation of the mounting machine 16 according to the first process procedure. The second process procedure-based control unit 102 is a functional unit that controls the operation of the mounting machine 16 according to the second process procedure. The control selection unit 104 is a functional unit that selects any one of the first process procedure-based control unit 100 and the second process procedure-based control unit 102, which controls the operation of the mounting machine 16.

<Setting of First Process Procedure and Second Process Procedure>

The first process procedure and the second process procedure are set using an optimization program 110 stored in the controller 92 of the control device 90. Specifically, the controller 92 stores various information such as the types of an electronic component, the number of electronic components, and the mounting positions of electronic components which are required to be mounted on a circuit substrate. Then, through the execution of the optimization program 110, the first process procedure is set by setting the types of an electronic component, the number of electronic components, the mounting positions of electronic components (electronic components being required to be mounted by each of the mounting machines 16) in such a manner that the total times are equalized. In contrast, through the execution of the optimization program 110, the second process procedure is set by setting the types of an electronic component, the number of electronic components, the mounting positions of electronic components (electronic components being required to be mounted by each of the mounting machines 16) in such a manner that the first process times are equalized and the second process times are equalized.

In addition, in the substrate process system 10, the first process procedure and the second process procedure are selected by the control selection unit 104; however, it is possible to select the first process procedure and the second process procedure by executing the optimization program 110. Specifically, through the execution of the optimization program 110, the grand total of the total times $T_1$ and the grand total of the total times $T_2$ are computed, and the grand total of the total times $T_1$ and the grand total of the total times $T_2$ are compared to each other. When the grand total of the process times $T_1$ is shorter than the grand total of the process times $T_2$, the first process procedure is selected, and when the grand total of the process times $T_2$ is shorter than the grand total of the process times $T_1$, the second process procedure is selected. That is, it is possible to select an optimum process procedure by executing the optimization program 110, and it is possible to reduce a process time.

As illustrated in FIG. 3, the optimization program 110 has first process setting means 112; second process setting means 114; and process selecting means 116. The first process setting means 112 causes the controller 92 to execute processing tasks for setting the first process procedure. The second process setting means 114 causes the controller 92 to execute processing tasks for setting the second process procedure. The procedure selecting means 116 causes the controller 92 to execute processing tasks for selecting one of the first process procedure and the second process procedure.

In the above-mentioned exemplary embodiment, the substrate process system 10 is an example of the substrate process system. The mounting machine 16 is an example of the mounting machine. The conveyor devices 40 and 42 are examples of the substrate transportation device. The control device 90 is an example of the control device. The first process procedure-based control unit 100, the second process procedure-based control unit 102, and the control selection unit 104 of the control device 90 are examples of the first process procedure-based control unit, the second process procedure-based control unit, and the control selection unit, respectively. The optimization program 110 is an example of the optimization program or device. The first process setting means 112, the second process setting means 114, and the procedure setting means 116 of the optimization program 110 are examples of the first process setting means, the second process setting means, and the procedure setting means, respectively. The number (S pieces) of circuit substrates planned for production is an example of the number of circuit substrates planned for production. The number (A pieces) of single lane processed circuit substrates is an example of the number of circuit substrates that are processed on one path. The number ((S−A) pieces) of dual lane processed circuit substrates is an example of the number of circuit substrates that are processed on two paths.

The present disclosure is not limited to the above-mentioned example, and various modifications and improvements can be made to the embodiment based on the knowledge of skilled persons in the related art. Specifically, for example, in the above-mentioned exemplary embodiment, one of the first process procedure and the second process procedure is selected based on the number (A pieces) of single lane processed circuit substrates and the number ((S−A) pieces) of dual lane processed circuit substrates; however, the selection of the first process procedure and the second process procedure may be made based on the number (S pieces) of circuit substrates planned for production. Specifically, the number (A pieces) of single lane processed circuit substrates compared to the number (S pieces) of circuit substrates planned for production further increases to the extent that the number (S pieces) of circuit substrates planned for production decreases, and the second process procedure is preferably selected. In contrast, the number ((S−A) pieces) of dual lane processed circuit substrates compared to the number (S pieces) of circuit substrates planned for production further increases to the extent that the number (S pieces) of circuit substrates planned for production increases, and the first process procedure is preferably selected. For this reason, for example, when the number (S pieces) of circuit substrates planned for production is less than a predetermined numeral, the second process procedure is selected. In contrast, when the number (S pieces) of circuit substrates planned for production is greater than or equal to a predetermined numeral, the first process procedure may be selected.

In the above-mentioned exemplary embodiment, the control selection unit 104 selects one of the first process procedure and the second process procedure; however, an operator can select one of the first process procedure and the second process procedure. Specifically, for example, it is possible to select the first process procedure and the second process procedure by providing a selection button for selecting one of the first process procedure and the second process procedure, and by operating the selection button.

In the above-mentioned exemplary embodiment, during production of S pieces of the circuit substrate planned for production, the control of the mounting machine 16 is executed according to any one of the first process procedure and the second process procedure; however, as necessary, the control of the mounting machine 16 may be switched between the control according to the first process procedure and the control according to the second process procedure. Specifically, during production of S pieces of the circuit substrate planned for production, the control of the mounting machine 16 may be executed according to the second process procedure when a mounting process is performed in a single lane, and the control of the mounting machine 16 may be executed according to the first process procedure when a mounting process is performed in dual lanes.

In the above-mentioned exemplary embodiment, the optimization program 110 is stored in the controller 92 of the control device 90; however, the optimization program 110 may be stored in a separate control device. That is, the optimization program 110 may be stored in a control device that is provided independently from the substrate process system 10.

REFERENCE SIGNS LIST

10: substrate process system
16: mounting machine (process machine)
40: conveyor device (substrate transportation device)
42: conveyor device (substrate transportation device)
90: control device
100: first process procedure-based control unit
102: second process procedure-based control unit
104: control selection unit
110: optimization program
112: first process setting means
114: second process setting means
116: procedure selecting means

The invention claimed is:

1. An optimization device that optimizes a process procedure for each of a plurality of process machines in a substrate process system which includes the plurality of process machines, each of the plurality of processing machines having a pair of substrate transportation devices for transporting circuit substrates on two paths and being arranged in a row, and the circuit substrates being transported on the two paths from an upstream process machine to a downstream process machine among the plurality of process machines, the device comprising:

first process setting means for setting a process procedure for each of the plurality of process machines so as to optimize a total process time that is a sum of (i) a process time for each of the plurality of process machines for a circuit substrate being transported on one of the two paths and (ii) a process time for each of the plurality of process machines for a circuit substrate being transported on an other of the two paths;

second process setting means for setting a process procedure for each of the plurality of process machines so as to:
optimize a process time for each of the plurality of process machines for a circuit substrate being transported on the one of the two paths, and
optimize a process time for each of the plurality of process machines for a circuit substrate being transported on the other of the two paths; and procedure selecting means for selecting one of a first process procedure and a second process procedure, the first process procedure being a process procedure that is set for each of the plurality of process machines by the first process setting means, and the second process procedure being a process procedure that is set for each of the plurality of process machines by the second process setting means, wherein the procedure selecting means selects the one of the first process procedure and the second process procedure based on whether circuit substrates that are planned for production in the substrate process system are processed on only one of the two paths or on both of the two paths.

2. The optimization device according to claim 1,
wherein a process performed on the one of the two paths indicates a process that is performed on one of opposite surfaces of a circuit substrate, and
wherein a process performed on the other of the two paths indicates a process that is performed on an other of the opposite surfaces of the circuit substrate.

3. The optimization device according to claim 1, wherein the procedure selecting means selects the one of the first process procedure and the second process procedure based on a number of the circuit substrates planned for production in the substrate process system.

4. The optimization device according to claim 3, wherein the procedure selecting means selects the one of the first process procedure and the second process procedure based on a number of circuit substrates that are processed on only one of the two paths among the circuit substrates planned for production and a number of circuit substrates that are processed on both of the two paths among the circuit substrates planned for production.

5. The optimization device according to claim 4, wherein the procedure selecting means:
computes a total time required to perform the first process procedures by all of the plurality of process machines and a total time required to perform the second process procedures by all of the plurality of process machines using the number of circuit substrates processed on only one of the two paths and the number of circuit substrates processed on both of the two paths,
selects the first process procedure when the total time required to perform the first process procedures is shorter than the total time required to perform the second process procedures, and
selects the second process procedure when the total time required to perform the second process procedures is shorter than the total time required to perform the first process procedures.

6. The optimization device according to claim 1, wherein each of the plurality of processing machines includes only one mounting head that mounts components on the circuit substrates on the two paths.

7. A substrate process system comprising:
a plurality of process machines, each of the plurality of processing machines having a pair of substrate transportation devices for transporting circuit substrates on two paths and being arranged in a row; and
a control device that controls an operation of each of the plurality of process machines,
wherein the circuit substrates are transported on the two paths from an upstream process machine to a downstream process machine among the plurality of process machines,
wherein the control device includes:
a first process procedure-based control unit that controls the operation of each of the plurality of process machines according to a process procedure which is set for each of the plurality of process machines so as to optimize a total process time that is a sum of (i) a process time for each of the plurality of process machines for a circuit substrate being transported on one of the two paths and (ii) a process time for each of the plurality of process machines for a circuit substrate being transported on an other of the two paths;
a second process procedure-based control unit that controls the operation of each of the plurality of process machines according to a process procedure which is set for each of the plurality of process machines so as to:
optimize a process time for each of the plurality of process machines for a circuit substrate being transported on the one of the two paths, and
optimize a process time for each of the plurality of process machines for a circuit substrate being transported on the other of the two paths;
a control selection unit that selects one of the first process procedure-based control unit and the second process procedure-based control unit to control the operation of each of the plurality of process machines based on whether circuit substrates that are planned for production in the substrate process system are processed on only one of the two paths or on both of the two paths.

8. The substrate process system according to claim 7, wherein the control selection unit selects the one of the first process procedure-based control unit and the second process procedure-based control unit to control the operation of each of the plurality of process machines based on a number of the circuit substrates planned for production in the substrate process system.

9. The substrate process system according to claim 8, wherein the control selection unit selects the one of the first process procedure-based control unit and the second process procedure-based control unit to control the operation of each of the plurality of process machines based on a number of circuit substrates that are processed on only one of the two paths among the circuit substrates planned for production and a number of circuit substrates that are processed on both of the two paths among the circuit substrates planned for production.

10. The substrate process system according to claim 7,
wherein a process performed on the one of the two paths indicates a process that is performed on one of opposite surfaces of a circuit substrate, and
wherein a process performed on the other of the two paths indicates a process that is performed on an other of the opposite surfaces of the circuit substrate.

11. The substrate process system according to claim 9, wherein the control selection unit:
computes a first total time required to perform the process procedure of the first process procedure-based control unit by the entirety of the plurality of process machines and a second total time required to perform the process procedure of the second process procedure-based control unit by the entirety of the plurality of process machines using the number of circuit substrates processed on only one of the two paths and the number of circuit substrates processed on both of the two paths,
selects the first process procedure-based control unit when the first total time is shorter than the second total time, and
selects the second process procedure-based control unit when the second total time is shorter than the first total time.

12. The substrate process system according to claim 7, wherein each of the plurality of processing machines includes only one mounting head that mounts components on the circuit substrates on the two paths.

13. An optimization device that optimizes a process procedure for each of a plurality of process machines in a substrate process system which includes the plurality of process machines, each of the plurality of processing machines having a pair of substrate transportation devices for transporting circuit substrates on two paths and being arranged in a row, and the circuit substrates being transported on the two paths from an upstream process machine to a downstream process machine among the plurality of process machines, the device comprising:

circuitry configured to:
set a first process procedure for each of the plurality of process machines so as to optimize a total process time that is a sum of (i) process time for each of the plurality of process machines for a circuit substrate being transported on one of the two paths and (ii) a process time for each of the plurality of process machines for a circuit substrate being transported on an other of the two paths;
set a second process procedure for each of the plurality of process machines so as to:
optimize a process time for each of the plurality of process machines for a circuit substrate being transported on the one of the two paths, and
optimize a process time for each of the plurality of process machines for a circuit substrate being transported on the other of the two paths; and
select one of the first process procedure and the second process procedure based on whether circuit substrates that are planned for production in the substrate process system are processed on only one of the two paths or on both of the two paths.

14. The optimization device according to claim 13, wherein a process performed on the one of the two paths indicates a process that is performed on one of opposite surfaces of a circuit substrate, and
wherein a process performed on the other of the two paths indicates a process that is performed on an other of the opposite surfaces of the circuit substrate.

15. The optimization device according to claim 1, wherein the circuitry is configured to select the one of the first process procedure and the second process procedure based on a number of the circuit substrates planned for production in the substrate process system.

16. The optimization device according to claim 15, wherein the circuitry is configured to select the one of the first process procedure and the second process procedure based on a number of circuit substrates that are processed on only one of the two paths among the circuit substrates planned for production and a number of circuit substrates that are processed on both of the two paths among the circuit substrates planned for production.

17. The optimization device according to claim 16, wherein the circuitry is configured to:
compute a total time required to perform the first process procedures by all of the plurality of process machines and a total time required to perform the second process procedures by all of the plurality of process machines using the number of circuit substrates processed on only one of the two paths and the number of circuit substrates processed on both of the two paths,
select the first process procedure when the total time required to perform the first process procedures is shorter than the total time required to perform the second process procedures, and
select the second process procedure when the total time required to perform the second process procedures is shorter than the total time required to perform the first process procedures.

18. The optimization device according to claim 13, wherein each of the plurality of processing machines includes only one mounting head that mounts components on the circuit substrates on the two paths.

* * * * *